United States Patent
Geissler et al.

(10) Patent No.: US 8,066,820 B2
(45) Date of Patent: Nov. 29, 2011

(54) PROCESS FOR CLEANING ARTICLES

(75) Inventors: Konrad Geissler, Zurich (CH); Marius Kuemin, Huenenberg (CH)

(73) Assignee: Dow Global Technologies LLC

( * ) Notice: Subject to any disclaimer, the term of this patent is extended or adjusted under 35 U.S.C. 154(b) by 0 days.

(21) Appl. No.: 12/936,942

(22) PCT Filed: Feb. 18, 2009

(86) PCT No.: PCT/US2009/034346
§ 371 (c)(1),
(2), (4) Date: Oct. 8, 2010

(87) PCT Pub. No.: WO2009/126369
PCT Pub. Date: Oct. 15, 2009

(65) Prior Publication Data
US 2011/0030736 A1    Feb. 10, 2011

(30) Foreign Application Priority Data
Apr. 9, 2008  (EP) .................................. 08103465

(51) Int. Cl.
B08B 3/00     (2006.01)
B08B 7/00     (2006.01)
B08B 5/00     (2006.01)
(52) U.S. Cl. ................................ 134/30; 134/10; 134/31
(58) Field of Classification Search .................... 134/30, 134/10, 26, 31
See application file for complete search history.

(56) References Cited

U.S. PATENT DOCUMENTS

| | | | |
|---|---|---|---|
| 3,424,805 A | | 1/1969 | Fruhwirth et al. |
| 4,507,155 A | * | 3/1985 | Cheek .............................. 134/6 |
| 4,690,158 A | * | 9/1987 | Yamada et al. ................. 134/107 |
| 5,105,556 A | * | 4/1992 | Kurokawa et al. .............. 34/470 |
| 5,114,607 A | | 5/1992 | Deck et al. |
| 5,120,370 A | * | 6/1992 | Mori et al. .................. 134/22.15 |
| 5,210,370 A | | 5/1993 | Mraz et al. |
| 5,401,414 A | * | 3/1995 | Wack et al. .................... 210/651 |
| 5,690,751 A | * | 11/1997 | Hosel et al. ...................... 134/30 |
| 5,876,510 A | | 3/1999 | Kuemin et al. |
| 6,350,395 B1 | | 2/2002 | Kuemin |
| 6,946,399 B1 | * | 9/2005 | Lorimer ........................ 438/704 |

FOREIGN PATENT DOCUMENTS

| | | | | |
|---|---|---|---|---|
| EP | 0587917 A1 | * | 8/1992 | ....................... 5/32 |
| EP | 0587917 A1 | * | 3/1994 | |
| EP | 587917 A1 | * | 3/1994 | |
| EP | 1191095 | | 5/2003 | |
| EP | 1700642 | | 9/2006 | |
| EP | 1338680 | | 4/2007 | |
| GB | 1049220 | | 10/1965 | |
| WO | 0236531 | | 5/2002 | |
| WO | 2008004957 | | 1/2008 | |

OTHER PUBLICATIONS

Industrial Cleaning Source Book. Ed. David S. Liebl. 1993. pp. 16-17.*

* cited by examiner

Primary Examiner — Michael Kornakov
Assistant Examiner — Arlyn I Rivera-Cordero

(57) ABSTRACT

A method of cleaning at least one article having a surface to be cleaned, the method comprising the steps of inserting the article into a cleaning chamber (3), subjecting the surface of the article to treatment with water vapor under conditions such that at least a portion of the water vapor condenses on said surface of the article as condensed water, and introducing an organic solvent into the cleaning chamber (3) and thereby removing the condensed water from the surface of the article, wherein no immersion of the article in water or aqueous solution takes place in the cleaning chamber.

8 Claims, 1 Drawing Sheet

PROCESS FOR CLEANING ARTICLES

CROSS-REFERENCE TO PRIOR APPLICATION

This application claims the benefit of European Patent Application No. 08103465.4 filed Apr. 9, 2008.

BACKGROUND OF THE INVENTION

The present invention relates to a method of cleaning articles and more particularly to a method of cleaning articles using water and organic solvents.

In many industrial processes, it is necessary to clean articles, either during finishing or before further processing in order to remove contaminants such as grease, salts and other water-soluble and water-insoluble impurities. Examples of articles which need to be cleaned include those with glass, metal or polymeric surfaces, such as printed circuit boards.

Articles of this type are typically cleaned using either an organic solvent formulation or an aqueous formulation. Organic solvent formulations are particularly suitable for removing non-polar contaminants, such as hydrocarbons. A range of different organic solvents are typically utilised, such as the isoparaffinic solvents disclosed in EP 1338680 and the glycol ethers disclosed in U.S. Pat. No. 5,876,510. Chlorinated and fluorinated hydrocarbons have also been used as a cleaning agent in, for example, WO 0236531, U.S. Pat. No. 3,424,805, and EP 1042257. However, for environmental reasons, the use of halogenated liquids is now considered less desirable.

It is a current preferred method of cleaning articles to use flammable hydrocarbons at a temperature above their flash point. Such a technique is disclosed in U.S. Pat. No. 5,690,751.

Aqueous formulations are particularly suitable for removing polar contaminants, such as metal salts. The salts dissolve in the aqueous formulation. It is conventional when utilising aqueous formulations to incorporate various other components in addition to water, particularly surfactants, acidic or basic compounds, and corrosion inhibitors, such as the formulations described in U.S. Pat. No. 5,114,607.

It is also known to use emulsions of water and organic solvent. DE 1298836 describes an emulsion comprising chlorinated hydrocarbons and water. DE 102005011236 describes a method of cleaning using the above emulsion in a closed loop machine. EP 1191095 describes a method of cleaning using an azeotropic solvent-water mixture having a miscibility gap.

It is known, in order to combine the effects of both organic and aqueous solvents, to employ both types of solvent sequentially. U.S. Pat. No. 5,876,510 discloses the use of a first cleaning agent which is a mixture of organic solvent and water, with the organic solvent in excess, followed by rinsing with a mixture in which the water is in excess.

EP 1338680 discloses a method of cleaning parts in which a mixture of isoparaffinic solvents is applied in a first washing step, followed by a second washing step using an aqueous solution containing detergents and finally followed by a rinsing step using deionized water. This method shows good cleaning properties, but requires a large amount of water to clean the parts, including the subsequent rinsing step. In addition, due to the time taken to fill the cleaning chamber with water and then empty it, as well as the time taken to dry water-wet parts, there is a long cycle time compared with the methods which use only one solvent. Furthermore, this method is also relatively energy inefficient.

U.S. Pat. No. 5,120,370 discloses a cleaning process in which the article is cleaned using superheated steam. In some embodiments, a solvent can be present in the chamber at the same point as the superheated steam. The constant flow of superheated steam helps remove the dust. However, neither steam nor solvent will condense on the surface of the article for sufficient time to dissolve the polar and non-polar contaminants. The solvent does not remove water from the surface of the article. In addition, superheated steam is more expensive to produce than non-superheated steam due to the additional energy requirements.

Accordingly, there is a requirement for a method of cleaning parts which provides excellent cleaning, but with reduced cycle times. In addition, it would be beneficial if such a method had a low wastage of solvent and water and good energy efficiency.

SUMMARY OF THE INVENTION

In a first aspect of the present invention, there is provided a method of cleaning at least one article having a surface to be cleaned. The surface to be cleaned typically contains polar and non-polar contaminants. The method comprising a first step of inserting the article into a cleaning chamber. Thereafter, the surface of the article is subjected to treatment with water vapour under conditions such that at least a portion of the water vapour condenses on said surface of the article as condensed water. The condensed water removes the polar contaminants from the surface of the article. The next step is the introduction of an organic solvent into the cleaning chamber, thereby removing the condensed water from the surface of the article. The organic solvent removes not only the condensed water, which contains the polar contaminants, but also the non-polar contaminants. The method is undertaken such that no immersion of the article in water or aqueous solution takes place in the cleaning chamber.

In an alternative aspect of the present invention, there is provided a method of cleaning at least one article having a surface to be cleaned, the method comprising the sequential steps of:

a) inserting the article into a cleaning chamber;
b) subjecting the surface of the article to treatment with water vapour under conditions such that at least a portion of the water vapour condenses on said surface of the article as condensed water; and
c) introducing an organic solvent into the cleaning chamber and thereby removing the condensed water from the surface of the article, wherein no immersion of the article in water or aqueous solution takes place in the cleaning chamber.

DETAILED DESCRIPTION OF THE INVENTION

Figure 1:
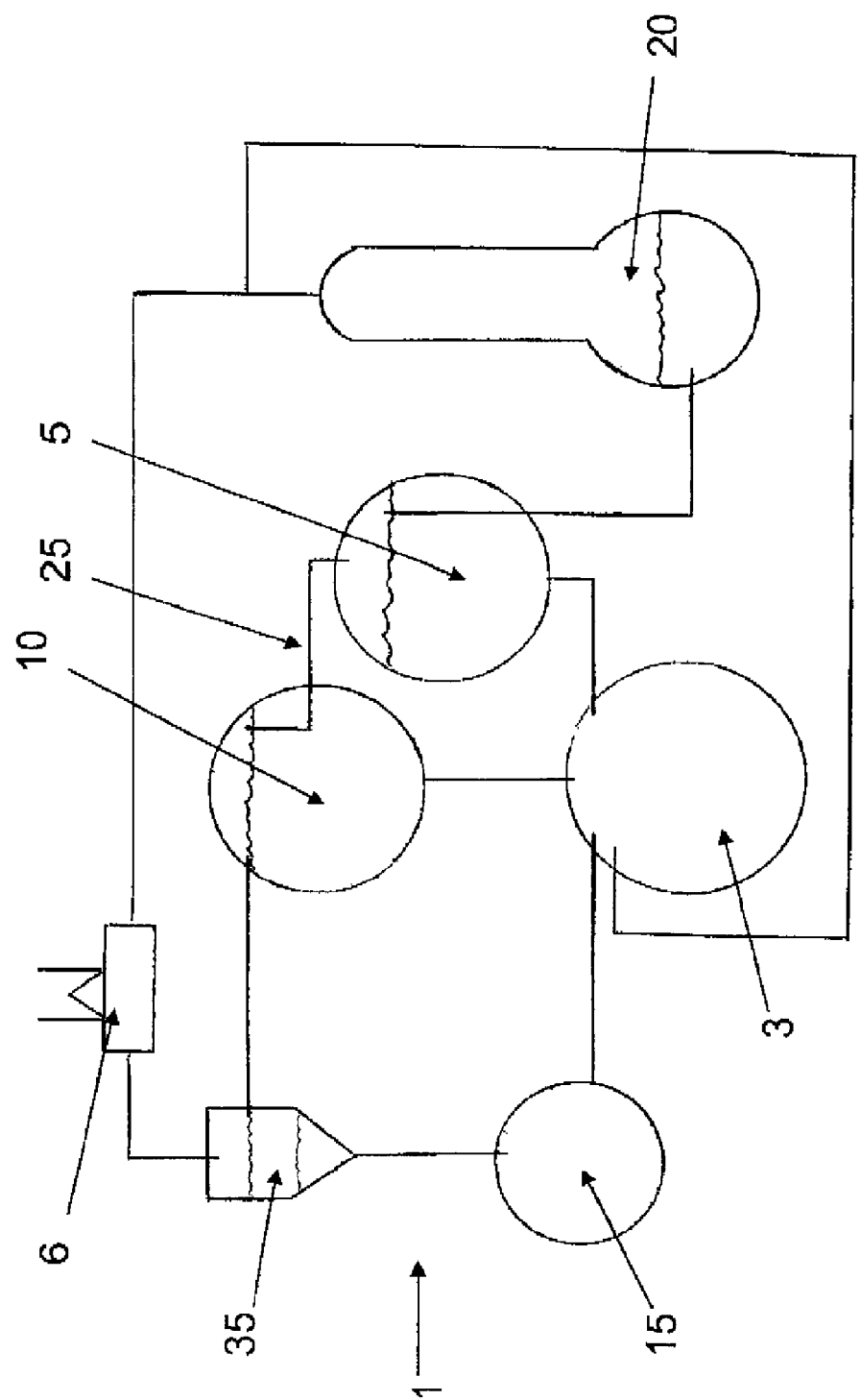
FIG. 1 shows a schematic of a cleaning apparatus suitable for undertaking the present invention.

An aqueous solution according to the present invention is one in which water is the primary dissolving medium. It is preferred that water constitutes at least 50 weight percent of an aqueous solution, more preferably 70 weight percent. An organic solvent containing relatively small amounts of water, such as where the organic solvent is used to rinse off the condensed water from the article to be cleaned, does not constitute an aqueous solution according to the present invention.

It is preferred that the aqueous solution does not comprise superheated steam. Superheated steam is steam which is heated beyond its saturation temperature. The use of superheated steam would increase the temperature of the cleaned article above the boiling point of water and lead to rapid re-evaporation of the condensed portion of the steam. It is preferred that the water vapour step produces a liquid film of condensed water vapour on the parts, which is subsequently removed by flushing with the solvent. This is not achieved when superheated steam is used.

The method according to the present invention advantageously provides good removal of polar contaminants from the surface of the article without the need for detergents or surfactants or the requirement to immerse the article in water or aqueous solution. In addition, as there is no immersion of the article in water or aqueous solution, the cycle time is reduced as the time taken to introduce the water vapour is significantly less than the time taken to fill and empty the cleaning chamber. In addition, the amount of waste is also reduced as the water, including the polar contaminants is removed in the organic solvent and the water can then be stripped from the solvent and recycled. The organic solvent displaces the condensed water from the article, with the polar contaminants being removed with the water. The organic solvent then dissolves the non-polar contaminants from the article.

As the water is recycled, it can contain small amounts of other components such as the solvent. Depending on the temperature and vapour pressure at which the water vapour is produced, the water vapour can therefore contain relatively small amounts of solvent. The presence of small amounts of solvent are not detrimental to the present invention.

However, in a preferred embodiment, the water vapour will consist essentially of water.

In one preferred embodiment, the water is introduced into the cleaning chamber in the form of water vapour or steam. In an alternative preferred embodiment, the water can be introduced into the chamber in liquid form, so long as the water is at a temperature which is sufficiently high to allow flash evaporation in the cleaning chamber due to the reduced pressure of the cleaning chamber. The skilled person will be aware of a number of methods of introducing water vapour into or producing water vapour in a cleaning chamber.

In a preferred embodiment of the present invention, after water has condensed on the article to be cleaned, the surface of the article can be further treated by spraying it with water droplets, rather than as steam. Suitable means for introducing the water in this step include an aerosol spray. In this embodiment, the water is introduced into the chamber in this additional step at a temperature below the dewpoint.

The method preferably comprises an additional step of introducing an organic solvent into the cleaning chamber to remove non-polar contaminants from the article prior to the introduction of water vapour. This first step will remove the bulk of the non-polar contaminants. Any remaining non-polar contaminants will be removed by the second organic solvent step, along with the condensed water. The use of two organic solvent steps improves the cleaning of the article.

In a preferred embodiment, the step of introducing the organic solvent is undertaken at a temperature above the flash point of the solvent. This is advantageous for the cleaning step using organic solvent. It is further preferred that the pressure in the chamber is below 200 mbar to reduce the risks associated with an explosion of the organic solvent. However, if the cleaning chamber is at a temperature above the dew point of water, which is dependent on the pressure in the chamber, the water vapour will not condense on the article to be cleaned. Therefore, it is further preferred that the step of introducing the organic solvent is undertaken at a temperature below the dew point of water. If a first organic solvent step at a temperature higher than the dew point of water is used, it may be necessary to lower the temperature in the cleaning chamber below the dew point before the water vapour is introduced.

In a preferred embodiment, the article is immersed in the organic solvent in at least one of the organic solvent introduction steps. It is further preferred that the article is immersed in both organic solvent introduction steps.

It is preferred that, in at least one of the organic solvent introduction steps, the organic solvent is introduced first by spraying the solvent onto the article and then by immersing the article with the organic solvent by filling the cleaning chamber. It is particularly preferred to introduce the organic solvent as a spray in the first organic solvent cleaning step, before application of the water vapour.

There are many different organic solvents which are known to the skilled person which are suitable according to the present invention. Suitable solvents are ones which have a high solvency power, chemical stability under cleaning conditions, do not react with water and dry quickly after cleaning when subjected to vacuum, heat or in an azeotropic mixture. The solvent used can be a single solvent or a mixture of solvents. Suitable organic solvents include aliphatic hydrocarbons, aromatic hydrocarbons, oxygen-containing organic compounds such as alcohols, esters, ethers, ketones, hydroxy ethers or mixtures thereof. Particularly preferred solvents comprise one or more glycol ether, isoparaffinic hydrocarbons and chlorinated hydrocarbons. Suitable ethylene and propylene glycol ether solvents include those which are available from The Dow Chemical Company under the trade designation DOWANOL and DOWCLENE.

Preferably, the organic solvent is recycled. After the organic solvent has been used to remove the condensed water, it will contain a relatively small quantity of water. In a preferred embodiment, this water is removed from the organic solvent before the organic solvent is reused for cleaning. It is further preferred that the contaminants are also removed from the organic solvent prior to recycling. In a preferred method of removing the water, the water-containing organic solvent is passed into a separate chamber where it is maintained at a constant pressure and temperature. Where the solvent has a boiling point higher than the water, the water evaporates at a higher rate than the solvent and so is removed. Further separation of the solvent and water can be undertaken where necessary by further distillation or phase separation. The contaminants in the solvent typically have a higher boiling point than the solvent and so can also be separated using distillation. The solvent is then reused. The water can also be reused by converting it to water vapour. In an alternative embodiment, the water is removed from the solvent by decanting it.

In a preferred cleaning method, the cleaning chamber is held under vacuum once the article has been inserted into the chamber for at least a period of the cleaning process. This allows the use of an organic solvent at temperatures at or above its flash point. The pressure is preferably less than 125 mbar. During the water introduction step, the pressure can be higher than 125 mbar, as water acts as an inert substance and suppresses flammability. An increase in pressure increases the dew point of water and therefore allows condensation of the steam on the article to be cleaned at a higher temperature.

A preferred method of carrying out the invention will be further described with reference to the drawings in which:

FIG. 1 shows a schematic of a cleaning apparatus suitable for undertaking the present invention.

In FIG. 1, a cleaning apparatus (1) is provided with a cleaning chamber (3). The cleaning chamber (3) is connected to a first solvent tank (5) containing DOWCLENE 1601, a propylene glycol ether-based cleaning fluid, commercially available from The Dow Chemical Company, as a cleaning solvent, a second solvent tank (10) also containing DOWCLENE 1601, a steam generator (15) and a solvent distillation and vapour generation chamber (20). An overflow pipe (25) is provided from the second solvent tank (10) to the first solvent tank (5).

The first solvent tank (5) feeds directly into the solvent distillation and vapour generation chamber (20). The solvent distillation and vapour generation chamber (20) feeds into a condenser unit (6), which in turn feeds into a water decanter (35). The water decanter (35) is connected to the steam generator (15) and the second solvent tank (10).

In operation, the articles to be cleaned (not shown), which have both polar and non-polar contaminants thereon, are introduced into the cleaning chamber (3). The pressure in the cleaning chamber is reduced to 125 mbar. The parts are then precleaned by introducing DOWCLENE 1601 from the first solvent tank (5) at a temperature of 60-80° C. The pressure and temperature of the solvent are such that the solvent will not detonate or combust. Additional mechanical force such as rotation or oscillation of the parts or introduction of ultrasound may be applied to the articles to assist in the removal of non-polar contaminants. The solvent is then pumped back into the first solvent tank (5).

Steam is produced in the steam generator (15) and fed into the cleaning chamber (3) at 100° C. The steam will condense on the articles to form a thin layer of water, which will either dissolve or undercut the polar contaminants. The amount of condensation will depend on the temperature difference between the article to be cleaned and the steam temperature. Solvent is then introduced from the second solvent tank (10) to immerse the articles. This solvent displaces the water layer, including the polar contaminants from the surface of the articles. The solvent also dissolves and undercuts any remaining non-polar contaminants. The subsequent lowering of pressure to 125 mbar can lead to removal of water droplets from the surface by flash vaporisation and hence prevent redeposition of, for example, salt residues. The cleaning process can again be aided by mechanical forces, such as rotation or oscillation of the parts and/or ultrasonic noise. The solvent is pumped back to the second solvent tank (10).

The solvent distillation and vapour generation chamber (20) produces solvent vapour which is fed into the cleaning chamber (3) during the solvent vapour cleaning step. The solvent condenses on the articles, removing any residual contaminants. Condensate from the chamber is routed into the second solvent tank (10). The condensed solvent is removed from the articles using a vacuum produced by a vacuum pump (not shown). The clean, dry articles can then be removed from the cleaning chamber (3).

The solvent distillation and vapour generation chamber (20) operates continuously either to produce solvent vapour for cleaning the articles or for solvent regeneration. When not feeding solvent vapour into the cleaning chamber (3), the solvent vapours are fed to condenser (30) and the condensate is fed to the water decanter (35). The aqueous phase is separated from the solvent phase in the water decanter (35). The aqueous phase is passed into the steam generator (15), whilst the solvent phase is passed into the second solvent tank (10). Any overflow from the second solvent tank (10) passes into the first solvent tank (5) via overflow pipe (25). Overflow from the first solvent tank passes into the solvent distillation and vapour generation chamber (20).

The recycling of water via the condenser and steam generator means that there is no requirement for a waste water stream in the apparatus. The contaminants present in the organic solvent, such as grease or salts, have a boiling point which is higher than the boiling point of the solvent and can be removed as the distillation bottoms from the distillation of the solvent.

SPECIFIC EMBODIMENTS OF THE INVENTION

The present invention will be further described with reference to the following Examples.

Examples 1 to 12

Tests were undertaken on glass mirrors of size 4 cm by 4 cm. Each mirror was soiled using 2 drops of synthetic fingerprint and 1 drop of aqueous metal working emulsion. The synthetic fingerprint was formed from a mixture of 0.9 weight percent NaCl based on the weight of the total composition, 0.4 weight percent urea based on the weight of the total composition, water and lactic acid to reduce the pH to 4.5. The metal working emulsion was BLASOCUT BC 125, commercially available from Blaser Swisslube Inc. The mirrors were dried in an oven at 60° C. for at least 15 minutes.

The mirrors were first pre-cleaned in hot DOWANOL PnB. The mirrors were then dried and conditioned i.e. the mirrors were given a controlled defined temperature before the condensation step. The mirrors were subsequently exposed to water vapour, which condensed on the mirror surface and allowed to drain before a final rinse in hot DOWANOL PnB. The time and temperature at which each step is undertaken is given below in Table 1. The cleanliness of each mirror was measured and given a rating of from 1 to 5, wherein: 1=no remaining residue; 2=low residue; 3=residue; 4=limited cleaning; 5=very limited cleaning.

TABLE 1

| | Precleaning | | Conditioning | | Water Vapour | | Rinsing | | |
|---|---|---|---|---|---|---|---|---|---|
| Example | t (s) | T (° C.) | t (min) | T (° C.) | Condensation (s) | Draining (s) | t (s) | T (° C.) | Result |
| 1 | 20 | 110 | 15 | 105 | 20 | 10 | 60 | 110 | 5 |
| 2 | 20 | 110 | 15 | 85 | 20 | 10 | 60 | 110 | 4 |
| 3 | 20 | 110 | 15 | 70 | 20 | 10 | 60 | 110 | 2 |
| 4 | 20 | 110 | 15 | 60 | 20 | 10 | 60 | 110 | 1 |
| 5 | 20 | 110 | 15 | 50 | 20 | 10 | 60 | 110 | 1 |
| 6 | 20 | 110 | 15 | 25 | 20 | 10 | 60 | 110 | 1 |
| 7 | 20 | 110 | 15 | 5 | 20 | 10 | 60 | 110 | 1 |

As can be seen in Table 1, there is a trend suggesting that a reduction in the conditioning temperature improves the cleaning process up to a certain point. In particular, where the temperature is above the dew point (e.g. at 105° C.) for water, the cleaning performance is unsatisfactory.

A number of tests were undertaken to see the effect of changing the water vapour application time. These results are set out in Table 2 below. The testing conditions are the same as for Examples 1 to 7, with changes only to the times and temperatures where shown in the table.

TABLE 2

| Example | Precleaning | | Conditioning | | Water Vapour | | Rinsing | | Result |
| | t (s) | T (° C.) | t (min) | T (° C.) | Condensation (s) | Draining (s) | t (s) | T (° C.) | |
| --- | --- | --- | --- | --- | --- | --- | --- | --- | --- |
| 2 | 20 | 110 | 15 | 85 | 20 | 10 | 60 | 110 | 4 |
| 8 | 20 | 110 | 15 | 85 | 0 | 0 | 60 | 110 | 5 |
| 9 | 20 | 110 | 15 | 85 | 60 | 10 | 60 | 110 | 2 |
| 10 | 20 | 110 | 15 | 70 | 60 | 10 | 60 | 110 | 1 |

It can be seen that a longer water vapour application time improves performance. Without the application of water vapour, the cleaning performance is very poor.

Tests were further undertaken to measure the effect of precleaning. These are shown in Table 3 below. Again, the testing conditions were the same as for the previous examples, with only some of the temperatures and conditions varying.

TABLE 3

| Example | Precleaning | | Conditioning | | Water Vapour | | Rinsing | | Result |
| | t (s) | T (° C.) | t (min) | T (° C.) | Condensation (s) | Draining (s) | t (s) | T (° C.) | |
| --- | --- | --- | --- | --- | --- | --- | --- | --- | --- |
| 9 | 20 | 110 | 15 | 85 | 60 | 10 | 60 | 110 | 2 |
| 11 | 0 | NA* | 15 | 85 | 60 | 10 | 60 | 110 | 3 |
| 12 | 0 | NA* | 15 | 25 | 60 | 10 | 60 | 110 | 2 |

*NA = Not Applicable

It can be seen that the cleaning effect is worse when there is no precleaning step. However, this can be offset by reducing the conditioning temperature prior to application of the water vapour.

The invention claimed is:

1. A method of cleaning at least one article having a surface to be cleaned, the method comprising the steps of:
   a) inserting the article into a cleaning chamber;
   b) subjecting the surface of the article to treatment with water vapour, wherein the water vapour does not comprise superheated steam, under conditions such that at least a portion of the water vapour condenses on said surface of the article as condensed water; and
   c) following step b), introducing an organic solvent into the cleaning chamber to immerse the article in the organic solvent and thereby removing the condensed water from the surface of the article;
   with the proviso that no immersion of the article in water or aqueous solution takes place in the cleaning chamber, and wherein the cleaning chamber is a closed cleaning chamber and is under a reduced pressure of less than or equal to 125 mbar during the introduction of the organic solvent.

2. The method of claim 1, wherein the organic solvent comprises a glycol ether and/or a chlorinated hydrocarbon.

3. The method of claim 1, wherein the method additionally comprises a further step of introducing an organic solvent into the cleaning chamber prior to the introduction of water vapour.

4. The method of claim 3, wherein the article is immersed in the organic solvent in at least one of the organic solvent introduction steps.

5. The method of claim 1, wherein the organic solvent is recycled.

6. The method of claim 5, wherein during the recycling step, water is removed from the solvent.

7. The method of claim 1, wherein the water vapour is produced by evaporation of a water-rich fraction of an at least partially water-miscible organic composition, wherein the composition has a higher boiling point than water.

8. The method of claim 7, wherein the water-miscible organic composition comprises the organic solvent.

* * * * *